United States Patent
Ng et al.

(10) Patent No.: US 9,356,248 B2
(45) Date of Patent: May 31, 2016

(54) ORGANIC THIN-FILM TRANSISTOR

(71) Applicant: Palo Alto Research Center Incorporated, Palo Alto, CA (US)

(72) Inventors: Tse Nga Ng, Palo Alto (HK); Ichiro Fujieda, Kusatsu (JP); Gregory Whiting, Menlo Park, CA (US); Bing R Hsieh, Pleasanton, CA (US)

(73) Assignee: PALO ALTO RESEARCH CENTER INCORPORATED, Palo Alto, CA (US)

( * ) Notice: Subject to any disclaimer, the term of this patent is extended or adjusted under 35 U.S.C. 154(b) by 140 days.

(21) Appl. No.: 13/969,293

(22) Filed: Aug. 16, 2013

(65) Prior Publication Data
US 2015/0048315 A1 Feb. 19, 2015

(51) Int. Cl.
*H01L 21/00* (2006.01)
*H01L 51/05* (2006.01)
*H01L 51/00* (2006.01)

(52) U.S. Cl.
CPC ......... *H01L 51/0566* (2013.01); *H01L 51/0053* (2013.01)

(58) Field of Classification Search
CPC .......... H01L 51/0512; H01L 51/0002
See application file for complete search history.

(56) References Cited

U.S. PATENT DOCUMENTS

| | | | |
|---|---|---|---|
| 7,095,044 B2 | 8/2006 | Brown et al. | |
| 7,351,606 B2 | 4/2008 | Arias | |
| 7,718,734 B2 | 5/2010 | Veres et al. | |
| 2012/0056183 A1* | 3/2012 | Mueller et al. | 257/57 |
| 2012/0056249 A1* | 3/2012 | Mueller et al. | 257/288 |
| 2015/0048315 A1* | 2/2015 | Ng et al. | 257/40 |

OTHER PUBLICATIONS

Zhong, et al., "Air-stable and high mobility n-channel organic transistors based on small-molecule/polymer semiconducting blends," Adv. Mater., 2012, doi: 10.1002/adma.201200859.

Baeg, et al., "Charge injection engineering of ambipolar field-effect transistors for high-performance organic complementary circuits," ACS Appl. Mater. Interfaces, 2011, 3, pp. 3205-3214, dx.doi.org/10.1021/am200705.

Smith et al., "Solution-processed small molecule-polymer blend organic thin-film transistors with hole mobility greater than 5cm2/Vs," Adv. Mater. 2012, 24, 2441. Doi: 10.1002/adma.201200088.

Lee, et al., "Enhanced electrical stability of organic thin film transistors with polymer semiconductor-insulator blended active layers," Appl. Phys. Lett., 2012, 100, 083302. Doi: 10.1063/1.3688177.

Goffri, et al., "Multicomponent semiconducting polymer systems with low crystallization-induced percolation threshold," Nat. Mater. 2006, 5, pp. 950-956. Doi: 10.1038/nmat1779.

Ng, et al., "Persistent photoconductivity effects in printed n-channel organic transistors," J. Appl. Phys. 113, 094506 (2013); doi: 10.1063/1.4794097.

* cited by examiner

*Primary Examiner* — Laura Menz
(74) *Attorney, Agent, or Firm* — Marger Johnson

(57) ABSTRACT

An n-type organic thin-film transistor including a substrate, a gate, and a dielectric layer covering the substrate and the gate. A semiconductor-insulator polymer blend layer is disposed on the dielectric layer; A source and a drain are disposed on top of the semiconductor-insulator polymer blend layer.

12 Claims, 5 Drawing Sheets

ORGANIC THIN-FILM TRANSISTOR

BACKGROUND

The ability to adjust characteristics of organic thin-film transistors (OTFTs) is crucial for implementation of organic circuits. Polymer based electronic devices represent an alternative to conventional inorganic based devices due to advances in polymer synthesis and polymer based device performance. Currently, only p-type OTFTs are available with adjustable characteristics.

Adjusting the characteristics of n-type OTFTs would be beneficial for organic circuits and complementary organic inverters.

DETAILED DESCRIPTION OF THE EMBODIMENTS

Figure 1:
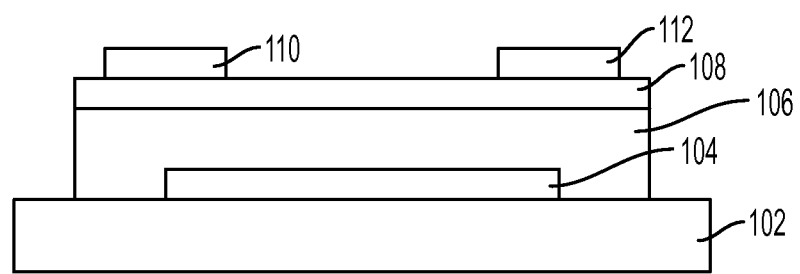
FIG. 1 shows an n-type OTFT according to embodiments of the disclosed technology.
Figure 2:
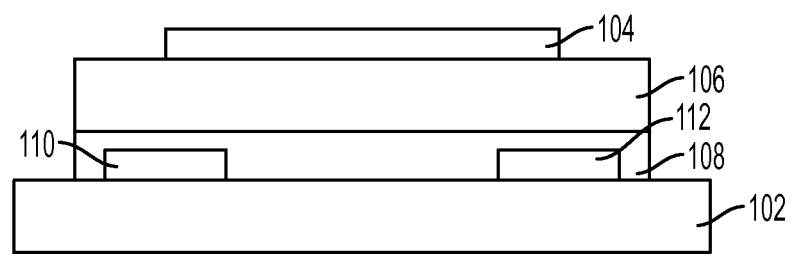
FIG. 2 shows an n-type OTFT according to other embodiment of the disclosed technology.

FIG. 1 shows the structure of an n-type OTFT 100 of some embodiments of the disclosed technology. The n-type OTFT 100 includes a substrate 102, a gate 104, a dielectric layer 106, a semiconductor-insulator polymer blend 108 (also referred to as a semiconductor-insulator blend) layer, a source 110 and a drain 112. FIG. 2 shows another structure of an n-type OTFT 200 that includes all of the same components of the n-type OTFT 100, except source 110 and the drain 112 are located on the substrate 102, layered by the semiconductor-insulator blend 108. Then a dielectric layer 106 is on top of the semiconductor-insulator blend 108, and the gate 104 is layered on top of the dielectric layer 106.

The substrate 102, gate 104, dielectric layer 106, source 110 and drain 112 may be composed of any known materials.

Figure 3:
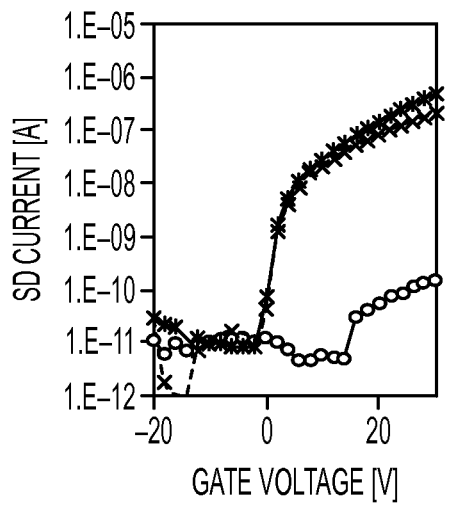
FIG. 3 shows the transfer characteristics of a semiconductor-insulator blend OTFT.
Figure 4:
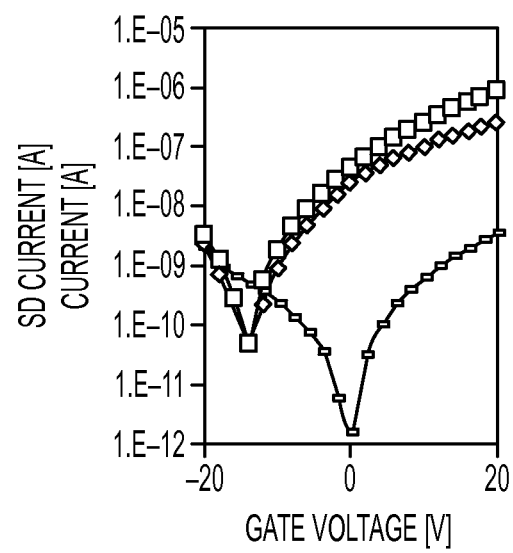
FIG. 4 shows the transfer characteristics of a neat semiconductor OTFT.

The semiconductor-insulator polymer blend 108, however, is a mixture of n-type perylene derivatives with and insulating polymer in a 2:1 ratio. The insulating polymer is preferable poly(α-methyl styrene) (PαMS). With this specific semiconductor-insulator polymer blend 108, the threshold voltage of the OTFT shifts to a more positive value compared to a neat semiconductor film, which contains only semiconductor material and not an added insulating polymer. This is shown in FIGS. 3 and 4. FIG. 3 shows the transfer characteristics of the n-type OTFT with the mixture of n-type perylene derivatives with PαMS in a 2:1 ratio. FIG. 4 shows the transfer characteristics of an n-type OTFT with a neat semiconductor. A source-drain voltage was applied at 5V, 30V, and 0V. Both of the devices show mobility of 0.02 cm$^2$/Vs at a gate voltage of 20V. However, the threshold voltage for the semiconductor-insulator polymer blend 108 is 12V whereas the threshold voltage for the neat semiconductor is only 4V. Accordingly, the threshold voltage shifts to a more positive value with the use of the semiconductor-insulator blend 108 compared to the use of the neat semiconductor film in an OTFT. Further, the on/off ratio of the OTFT is much better with the semiconductor-insulator blend 108 OTFT with a value of 10$^3$ for a voltage range of 0V to 20V, and only 50 for the same voltage range for the neat semiconductor OTFT.

The introduction of a semiconductor-insulator blend 108 allows an n-type OTFT 100 or 200 to be tuned to function in enhancement mode. Without the semiconductor-insulator blend 108 the n-type OTFTs typically operate in a depletion mode. The semiconductor-insulator blend 108 allows the ability to control a threshold voltage of an n-type OTFT. Further, the on-off ratio of the n-type OTFT can also be controlled.

Figure 6:
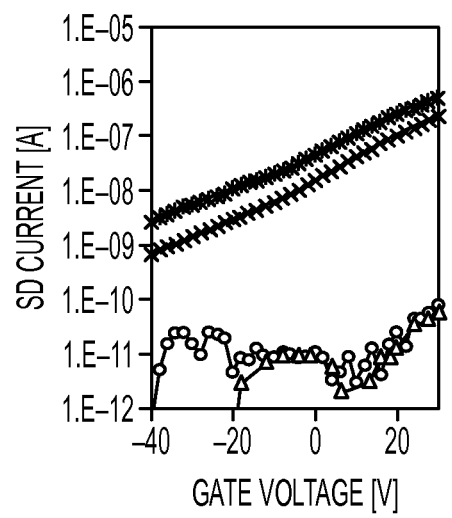
FIG. 6 shows the transfer characteristics of a neat semiconductor OTFT.

In n-type OTFTs, if printed silver electrodes are used, the contact resistance limits the performance of the device. It is known that cesium salts, such as CsCO$_3$, used as electrode dopants adjust the function of noble metals to match n-type semiconductor conduction band energy. It has also been found, however, that blanket coating of the cesium salts over substrates leads to an undesirable sub-threshold slope and high off-current as can be seen in FIG. 6 with a neat semiconductor film.

Figure 5:
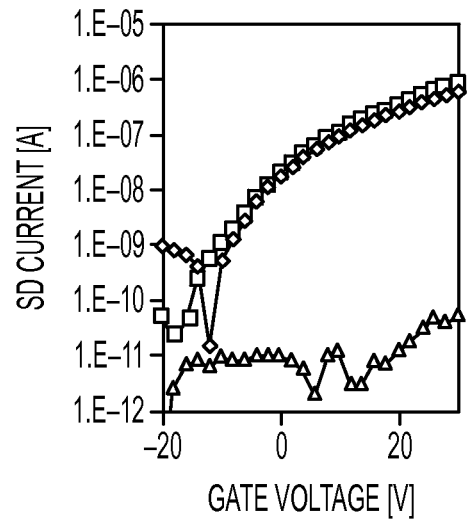
FIG. 5 shows the transfer characteristics of a semiconductor-insulator blend OTFT.
Figure 7:
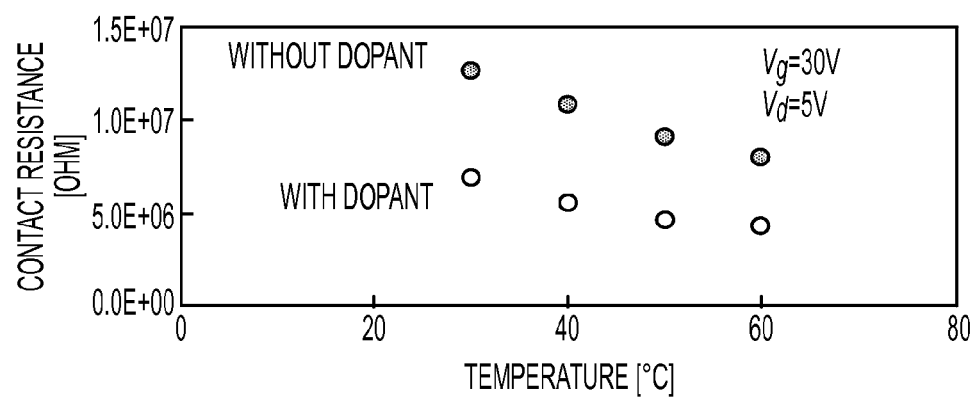
FIG. 7 shows the contact resistance of a semiconductor-insulator blend OTFT with and without a dopant added to the electrodes.

Using the semiconductor-insulator blend 108 discussed above reduces this undesirable characteristic. The semiconductor-insulator blend 108 improves the sub-threshold slope and shifts the threshold voltage to a more positive value as seen in FIG. 5. The cesium salt dopant lowers the contact resistance of the electrodes by two times, as shown in FIG. 7.

When the n-type OTFT includes both the dopant in the electrodes and the semiconductor-insulator blend, the OTFT continues to operate in depletion mode rather than an enhancement mode. The on/off ratio, however, is still better with the semiconductor-insulator blend 108 rather than with only a neat semiconductor.

As discussed above, FIGS. 5 and 6 compare the transfer characteristics between n-type OTFTs with the semiconductor-insulator blend 108 (FIG. 5) and a neat semiconductor (FIG. 6). Each of these graphs show source-drain voltages at 5V, 30V and 0V. Both of the devices, the semiconductor-insulator blend OTFT and the neat semiconductor OTFT, show mobility of 0.04 cm$^2$/Vs at a gate voltage of 20V. The threshold voltage for the semiconductor-insulator blend OTFT, however, is 8V while the threshold voltage for the neat semiconductor OTFT is only 2V. Accordingly, even with the use of the cesium salt dopant with the electrodes, the semiconductor-insulator blend 108 used with the OTFT improves the threshold voltage to a more positive value.

Figure 8:
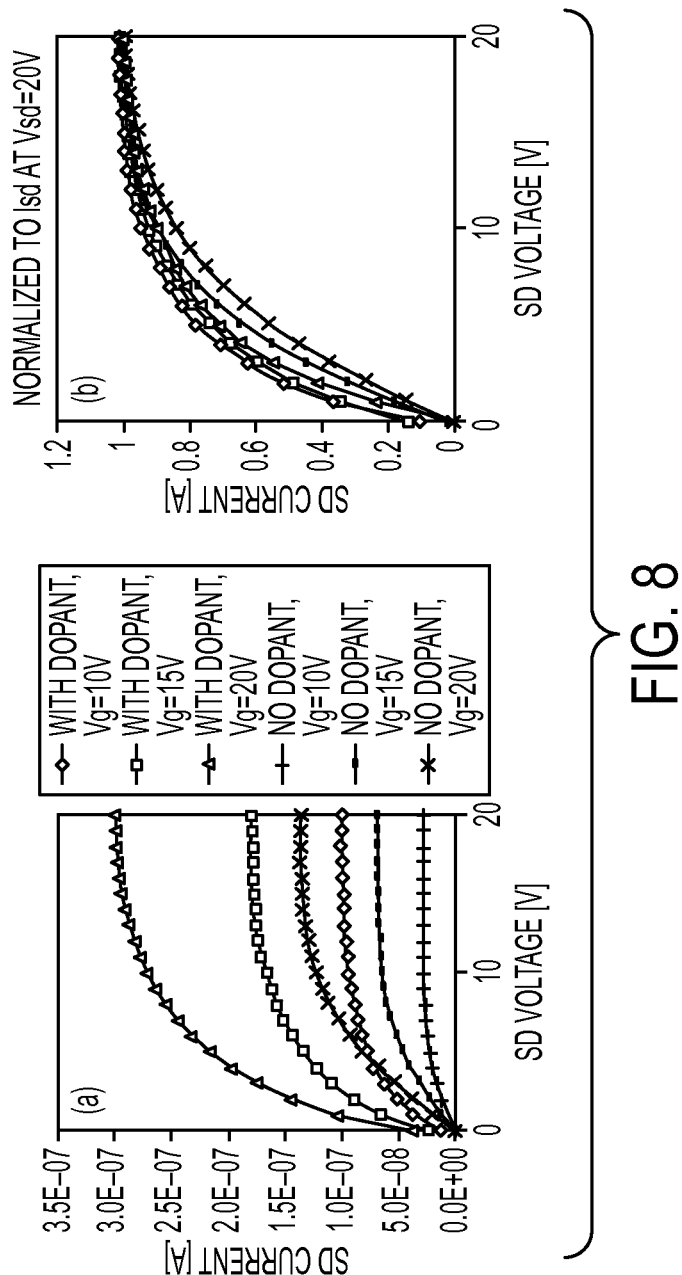
FIG. 8 shows the output characteristics of a semiconductor-insulator blend OTFT with and without a dopant added to the electrodes as measured.

FIG. 8 shows the output characteristics of n-type OTFTs using the semiconductor-insulator blend of the disclosed technology. Graph (a) shows the comparison between the semiconductor-insulator blend where a dopant is used on the electrodes and not used on the electrodes. Graph (b) is normalized to show the higher contact resistance in a linear regime.

Introduction of the insulator polymer binder into a semiconductor allows for the tuning of a transistor voltage with a very minimal effect on the device mobility. As discussed above, the semiconductor-insulator blend also works better with a cesium salt contact dopant compared to a neat semiconductor to lower the contact resistance of the electrodes.

Although a 2:1 ratio of n-type perylene derivatives with PαMS was discussed above, other ratios of the semiconductor-insulator blend 108 may be used to control the threshold voltage of an n-type OTFT. Ratios of n-type perylene derivatives with PαMS that can be used are 3:1, 1:1, and 1:2, for example. Each of these different ratios results in different threshold voltages for the OTFT.

The OTFTs of the disclosed technology can be fabricated from inkjet printing and any other known solution processing techniques.

Other variations and modifications exist. For example, the disclosed technology is not limited to PαMS as a polymer binder. The polymer binder combined with the n-type perylene derivatives can be other insulating polymers, such as polyethylene or polymethylmethacrylate. Further, the polymer binder can instead be a semiconducting polymer rather than an insulator. However, the ratios for combining the perylene derivatives and these alternative materials would still be equivalent to the ratios discussed above with respect to PαMS.

Although cesium salt is described above for the contact dopant, other materials may be used. For example, the contact dopant may be a self-assembled monolayer, based for example, on thiol chemistry. The contact dopant may also be polyelectrolytes such as polyethyleneimine in addition to cesium salts.

The semiconductor-insulator blend discussed above with respect to the disclosed technology can also be implemented in a complementary organic inverter. The semiconductor-insulator blend 108 reduces the leakage current and the power consumption of the complementary organic inverter.

It will be appreciated that several of the above-disclosed and other features and functions, or alternatives thereof, may be desirably combined into many other different systems or applications. Also that various presently unforeseen or unanticipated alternatives, modifications, variations, or improvements therein may be subsequently made by those skilled in the art which are also intended to be encompassed by the following claims.

What is claimed is:

1. An n-type organic thin-film transistor, comprising:
a substrate;
a source;
a drain,
wherein the source and the drain are disposed on top of the substrate;
a semiconductor-insulator polymer blend layer layered on the substrate, covering the source and drain, wherein the semiconductor-insulator polymer blend layer comprises a mixture of n-type perylene derivatives and an insulating polymer;
a dielectric layer disposed on the semiconductor-insulator blend layer; and
a gate layered on the dielectric layer.

2. The n-type organic thin-film transistor of claim 1, wherein the insulating polymer is one of poly(α-methyl styrene), polyethylene, or polymethylmethacrylate.

3. The n-type organic thin-film transistor of claim 2, wherein the insulating polymer is poly(α-methyl styrene).

4. The n-type organic thin-film transistor of claim 1, wherein the mixture is in a ratio of 2:1.

5. The n-type organic thin-film transistor of claim 1, wherein the mixture is in a ratio of 3:1.

6. The n-type organic thin-film transistor of claim 1, wherein the mixture is in a ratio of 1:1.

7. The n-type organic thin-film transistor of claim 1, wherein the source and the drain are doped with a contact dopant.

8. The n-type organic thin-film transistor of claim 1, wherein a threshold voltage is 12V.

9. The n-type organic thin-film transistor of claim 7, wherein a threshold voltage is 8V.

10. The n-type organic thin-film transistor of claim 1, wherein an on/off ratio is $10^3$ for a voltage range of 0V to 20V.

11. The n-type organic thin-film transistor of claim 7, wherein the contact dopant is cesium salt.

12. The n-type organic thin-film transistor of claim 7, wherein the contact dopant is a polyelectrolyte.

* * * * *